United States Patent
Nakano et al.

(10) Patent No.: US 8,053,937 B2
(45) Date of Patent: Nov. 8, 2011

(54) LINEAR MOTOR, STAGE APPARATUS AND EXPOSURE APPARATUS

(75) Inventors: Katsushi Nakano, Kamagaya (JP); Shigeru Morimoto, Kamagaya (JP); Shigeki Kageyama, Fukaya (JP)

(73) Assignee: Nikon Corporation, Tokyo (JP)

( * ) Notice: Subject to any disclaimer, the term of this patent is extended or adjusted under 35 U.S.C. 154(b) by 390 days.

(21) Appl. No.: 11/795,518

(22) PCT Filed: Jan. 20, 2006

(86) PCT No.: PCT/JP2006/300827
§ 371 (c)(1),
(2), (4) Date: May 19, 2008

(87) PCT Pub. No.: WO2006/077958
PCT Pub. Date: Jul. 27, 2006

(65) Prior Publication Data
US 2008/0265688 A1    Oct. 30, 2008

(30) Foreign Application Priority Data
Jan. 21, 2005  (JP) ................................. 2005-013824

(51) Int. Cl.
*H02K 41/02*     (2006.01)
(52) U.S. Cl. ................. 310/12.01; 310/12.21; 310/12.24
(58) Field of Classification Search ............... 310/12.01, 310/12.15–12.16, 12.21–12.24, 12.31, 12.33, 310/13–14
See application file for complete search history.

(56) References Cited

U.S. PATENT DOCUMENTS

| | | | | |
|---|---|---|---|---|
| 3,770,995 A | * | 11/1973 | Eastham et al. | 104/294 |
| 4,803,388 A | * | 2/1989 | Nikura | 310/12.27 |
| 4,916,340 A | * | 4/1990 | Negishi | 310/12.13 |
| 5,057,723 A | * | 10/1991 | Umehara et al. | 310/12.04 |
| 5,528,118 A | | 6/1996 | Lee | |
| 5,701,041 A | * | 12/1997 | Akutsu et al. | 310/12.06 |
| 5,874,820 A | | 2/1999 | Lee | |
| 6,236,124 B1 | * | 5/2001 | Sekiyama et al. | 310/12.24 |
| 6,965,176 B2 | * | 11/2005 | Hsiao | 310/12.17 |
| 7,696,651 B2 | * | 4/2010 | Miyamoto | 310/12.26 |
| 2007/0247008 A1 | * | 10/2007 | Miyamoto | 310/14 |

FOREIGN PATENT DOCUMENTS

| | | |
|---|---|---|
| JP | A-8-80028 | 3/1996 |
| JP | A 08-166475 | 6/1996 |
| JP | A 08-330224 | 12/1996 |
| JP | A-9-174368 | 7/1997 |
| JP | A 11-196561 | 7/1999 |
| JP | A-2000-228855 | 8/2000 |
| JP | A 2001-145328 | 5/2001 |
| JP | A 2004-056864 | 2/2004 |

OTHER PUBLICATIONS

International Search Report issued for PCT/JP2006/300827 on Apr. 18, 2006 with an English Translation.

(Continued)

*Primary Examiner* — Thanh Lam
(74) *Attorney, Agent, or Firm* — Oliff & Berridge, PLC

(57) ABSTRACT

A linear motor is equipped with a coil body (62), and a yoke (71) that supports a magnetism generating body (72) and that moves relative to the coil body (62). The yoke (71) has a first portion (73) that is formed from a magnetic material and disposed based on the saturation state of the magnetic field, which is generated by the magnetism generating body (72), in the yoke (71).

13 Claims, 11 Drawing Sheets

OTHER PUBLICATIONS

Written Opinion issued for PCT/JP2006/300827 on Apr. 18, 2006 with an English Translation.

May 24, 2011 Office Action issued in Japanese Patent Application No. 2006-553961 (w/English-language Translation).

* cited by examiner

LINEAR MOTOR, STAGE APPARATUS AND EXPOSURE APPARATUS

TECHNICAL FIELD

The present invention relates to a linear motor, a stage apparatus that comprises the linear motor, which serves as a drive apparatus, and an exposure apparatus that uses the stage that is driven by the linear motor to expose a substrate with a pattern of a mask.

This application claims priority to Japanese Patent Application No. 2005-013824, filed on Jan. 21, 2005, the disclosure of which are incorporated herein by reference in its entirety.

BACKGROUND ART

In exposure apparatuses that are used in the manufacturing of, for example, semiconductor devices and liquid crystal display devices, many linear motors, which are capable of noncontactual drive, are used as drive apparatuses of, for example, reticle stages on which masks (reticles and the like) are mounted and wafer stages on which photosensitive substrates (wafers, glass plates, and the like) are mounted.

This type of linear motor comprises a structural body that has a group of coil bodies and rows of permanent magnets that sandwich the coil bodies from above and below; in addition, the permanent magnets are fixed by, for example, bonding them to a magnetic body, i.e., a yoke, so as to hold them and form magnetic paths through which their magnetic flux passes. Furthermore, the linear motor is configured so that it obtains drive power (thrust) produced from the Lorentz force generated by energizing the coil bodies, which are positioned in the magnetic field produced by the permanent magnets.

The lines of magnetic force that are generated by the coil bodies act on a casing, which houses the coils, as well as on the permanent magnets and the yoke that supports such; however, if a fluctuating magnetic field acts on the casing, which is a conductor, the permanent magnets, or the yoke, then eddy currents will arise in the vicinity of the surface of the conductor, and those eddy currents counteract the magnetic field fluctuations. Therefore, Patent Document 1 discloses a technology wherein the coil body casing is formed from a highly conductive plate material and an opening is provided therein in order to adjust the value of the resistance to the eddy currents.

Patent Document 1 Japanese Unexamined Patent Application, Publication No. H11-196561

DISCLOSURE OF INVENTION

Problems to be Solved by the Invention

Nevertheless, the related art discussed above has the following types of problems.

In the conventional technology discussed above, the eddy current generated in the casing of the coil bodies is adjusted; however, an eddy current is generated not only in the casing, but also in, for example, the permanent magnets and the yoke.

If eddy currents flow in, for example, the permanent magnets and the yoke, then heat is generated as a result of joule loss. There is a risk that the heat generated by the linear motor will thermally deform the surrounding members and apparatuses and change the air temperature in the optical path of an optical interferometric length measuring instrument that is used to detect the position of the stages, which will cause errors in the measurement values and thereby reduce pattern transfer accuracy.

In particular, it is necessary to supply an electric current to the coil bodies as well as to cool them because of the heat that they generate; consequently, if we assume that the coil bodies are provided to a stator (taking into consideration a configuration that connects the electric current supply wiring and the refrigerant piping), and that the permanent magnets, which do not require wiring and piping, are provided to movable bodies, then it is difficult to separately provide a mechanism for cooling the yoke.

A purpose of some aspects of the invention is to provide a linear motor that can suppress the generation of heat by a yoke when the motor is driven, a stage apparatus that comprises the linear motor, which serves as a drive apparatus, and an exposure apparatus.

Means for Solving the Problem

A linear motor of the present invention comprises: a coil body; and a yoke that supports a magnetism generating body and that moves relative to the coil body; wherein, the yoke comprises a first portion that is formed from a magnetic material and disposed based on the saturation state of the magnetic field, which is generated by the magnetism generating body, in the yoke.

The yoke forms a magnetic path for the lines of magnetic force generated by the magnetic field emitting body, and a strong magnetic field (DC magnetic field) acts in the vicinity of the magnetic field emitting body, which creates a state wherein the magnetic field is substantially saturated. In this magnetically saturated state, the magnetic permeability of the yoke with respect to the fluctuating magnetic field (AC magnetic field), which superimposingly acts on the yoke, further decreases. (Herein, the DC magnetic field is sufficiently greater than the superimposed AC magnetic field. This is a general condition in linear motors.) Here, when the magnetic permeability is high, the skin depth through which the eddy currents flow is small, and therefore the eddy currents concentrate in this thin skin portion. If the electric currents concentrate in the thin portion, then the cross sectional area through which the electric currents flow decreases and the resistance value with respect to the eddy currents consequently increases, which also increases the amount of heat generated. Furthermore, when the fluctuating magnetic field penetrates, for example, the yoke, the eddy currents flow so that they inhibit the fluctuating magnetic field; however, after the eddy currents settle, if the magnetic permeability of the yoke increases, then even larger magnetic force lines will be drawn into the yoke, and eddy currents will consequently flow so as to further inhibit the fluctuating magnetic field. Consequently, heat generation increases more in the portions of the yoke at which magnetic permeability is high due to this synergistic effect.

Accordingly, the present invention can suppress the yoke's generation of heat by disposing the first portion, which is formed from a magnetic material and is needed in order to form the magnetic path, at a portion of the yoke where the magnetic permeability is low, i.e., a portion where the magnetic field is in a substantially saturated state.

Moreover, hysteresis heat generation is proportional to the interior surface area of the hysteresis curve, and the portion inside the yoke where magnetic permeability is high and that is magnetically unsaturated has a larger hysteresis curve interior surface area and a larger amount of heat generation than the portion where the magnetic permeability is low and that is magnetically saturated. Consequently, similar to the case wherein the eddy currents were taken into consideration, the present invention can suppress the generation of heat by the yoke by disposing the first portion based on the magnetic saturation state.

Furthermore, the magnetic saturation state in the present specification means a state wherein the rate of increase of the magnetic flux density in the yoke is saturated even if the external magnetic field acting thereon increases, and the magnetic flux density does not increase substantially even if the external magnetic field further increases.

In addition, a linear motor of the present invention comprises: a coil body; and a yoke that supports a magnetism generating body and moves relative to the coil body, wherein the yoke is formed from a material that is selected based on a magnetic saturation characteristic.

Accordingly, with the present invention, the yoke is formed from a material such as ferrite or permendur. Because ferrite, permendur, and the like have a saturated magnetic flux density that is greater than that of iron (e.g., SS400), which is normally used as the yoke material, it is possible to generate sufficient magnetic flux at least inside the yoke. Moreover, because hysteresis heat generation is proportional to volume, it is possible to suppress such by forming the yoke with ferrite, permendur, or the like, and reducing the volume thereof.

In a stage apparatus of the present invention, the abovementioned linear motor is used as the drive apparatus. In addition, an exposure apparatus of the present invention is an exposure apparatus that uses a stage apparatus to expose a pattern on a substrate, wherein the abovementioned stage apparatus is used as the stage apparatus.

Accordingly, with the stage apparatus and the exposure apparatus of the present invention, it is possible to suppress the generation of heat by the yoke during the drive of the motor, and to suppress a decrease in pattern transfer accuracy that is caused by the thermal deformation of the apparatuses, which decreases the position detection accuracy of the stage.

ADVANTAGE OF THE INVENTION

With the present invention, it is possible to efficiently suppress, for example, eddy currents, which arise due to the lack of magnetic saturation, as well as to suppress hysteresis heat generation.

In addition, the present invention can prevent a decrease in pattern transfer accuracy by suppressing heat generation.

BEST MODE FOR CARRYING OUT THE INVENTION

The following explains a linear motor, a stage apparatus, and an exposure apparatus of the present invention, referencing the drawings.

First Embodiment

Figure 1:
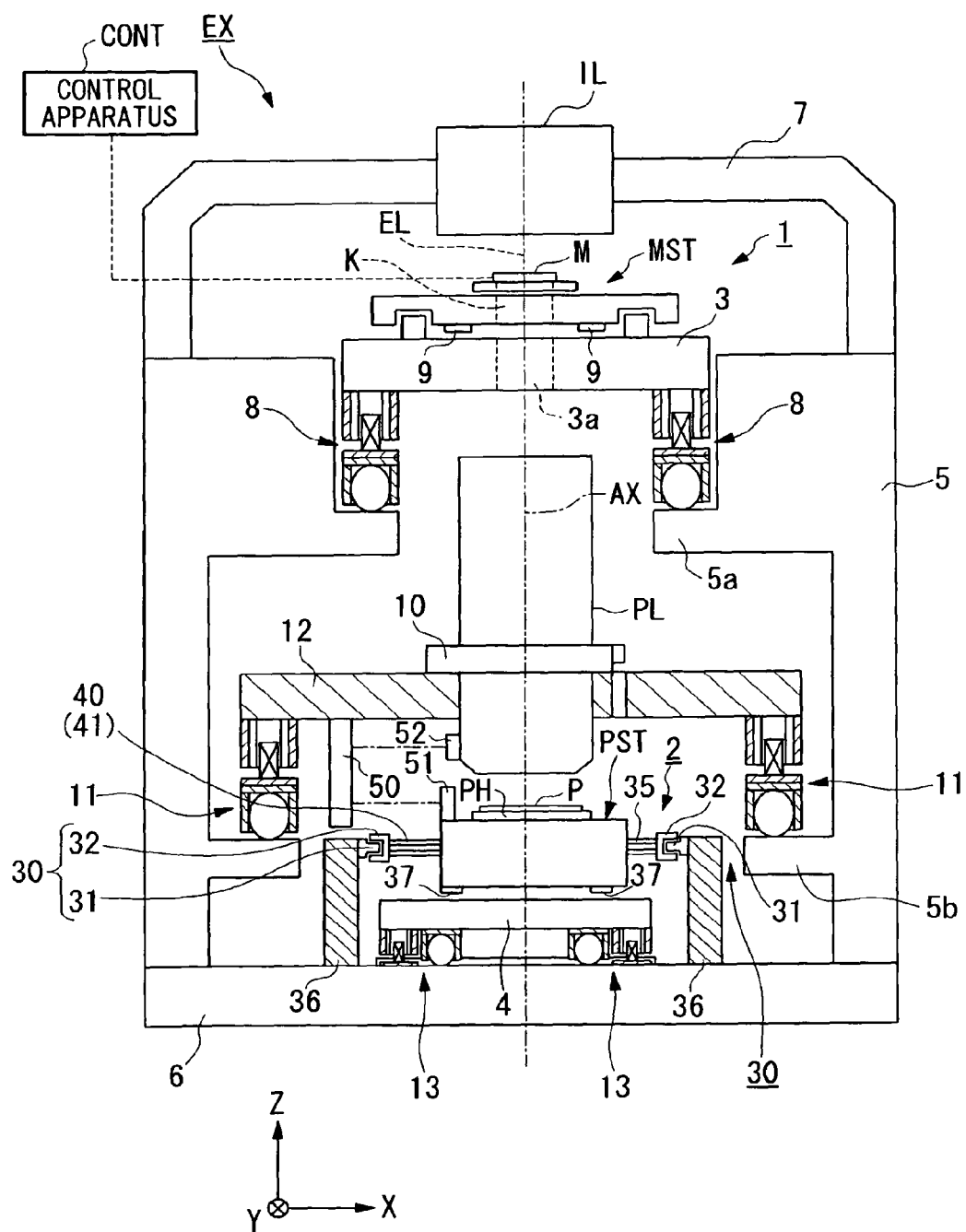
FIG. 1 is a schematic block diagram that shows one embodiment of an exposure apparatus that comprises linear motors of the present invention.

FIG. 1 is a schematic block diagram that shows one embodiment of an exposure apparatus that comprises linear motors, which serve as drive apparatuses, of the present invention. Here, an exposure apparatus EX of the present embodiment is a so-called scanning stepper that transfers a pattern, which is provided in a mask M, to a photosensitive substrate P via a projection optical system PL while moving the mask M and the photosensitive substrate P synchronously. In the following explanation, the directions that coincide with an optical axis AX of the projection optical system PL are the Z axial directions, the directions of synchronous movement (scanning directions) within the plane that is perpendicular to the Z axial directions are the Y axial directions, and the directions (non-scanning directions) that are perpendicular to the Z axial directions and the Y axial directions are the X axial directions. Furthermore, the rotational directions around the X, Y, and Z axes are the θX, θY, and θZ directions, respectively. Furthermore, "photosensitive substrate" herein includes a semiconductor wafer that is coated with a photoresist, and "mask" includes a reticle wherein a device pattern, which is to be reduction projected onto the photosensitive substrate, is formed.

In FIG. 1, the exposure apparatus EX comprises: a stage apparatus 1, which has a mask stage (reticle stage) MST that holds and moves the mask (reticle) M, and a mask base plate 3 that supports the mask stage MST; an illumination optical system IL that has a light source and illuminates the mask M, which is supported by the mask stage MST, with exposure light; a stage apparatus 2 that has a substrate stage PST, which holds and moves the photosensitive substrate (substrate) P, and a substrate base plate 4, which supports the substrate stage PST; a projection optical system PL that projects a pattern image of the mask M, which is illuminated by exposure light EL, to the photosensitive substrate P, which is supported by the substrate stage PST; a reaction frame 5 that supports the stage apparatus 1 and the projection optical system PL; and a control apparatus CONT that controls the overall operation of the exposure apparatus EX. The reaction frame 5 is installed on a base plate 6, which is mounted horizontally on a floor surface, and step parts 5a, 5b, which protrude toward the inner side, are formed on the upper part side and the lower part side, respectively, of the reaction frame 5.

The illumination optical system IL is supported by a support column 7, which is fixed to an upper surface of the reaction frame 5. Examples of light that can be used as the exposure light EL emitted from the illumination optical system IL include: deep ultraviolet light (DUV light), such as KrF excimer laser light (248 nm wavelength) and the bright lines (g-, h-, and i-lines) in the ultraviolet region emitted from, for example, a mercury lamp; and vacuum ultraviolet light (VUV light), such as ArF excimer laser light (193 nm wavelength) and $F_2$ laser light (157 nm wavelength).

The mask base plate 3 of the stage apparatus 1 is supported at each corner substantially horizontally via a vibration isolating unit 8 on the step part 5a of the reaction frame 5, and comprises an opening 3a at its center part through which the pattern image of the mask M passes. The mask stage MST is provided on the mask base plate 3 and comprises an opening K at its center part that communicates with the opening 3a of the mask base plate 3 and through which the pattern image of the mask M passes. A plurality of air bearings 9, each of which is a noncontact bearing, is provided to a bottom surface of the mask stage MST, which is levitationally supported by the air bearings 9 with a prescribed clearance with respect to the mask base plate 3.

Figure 2:
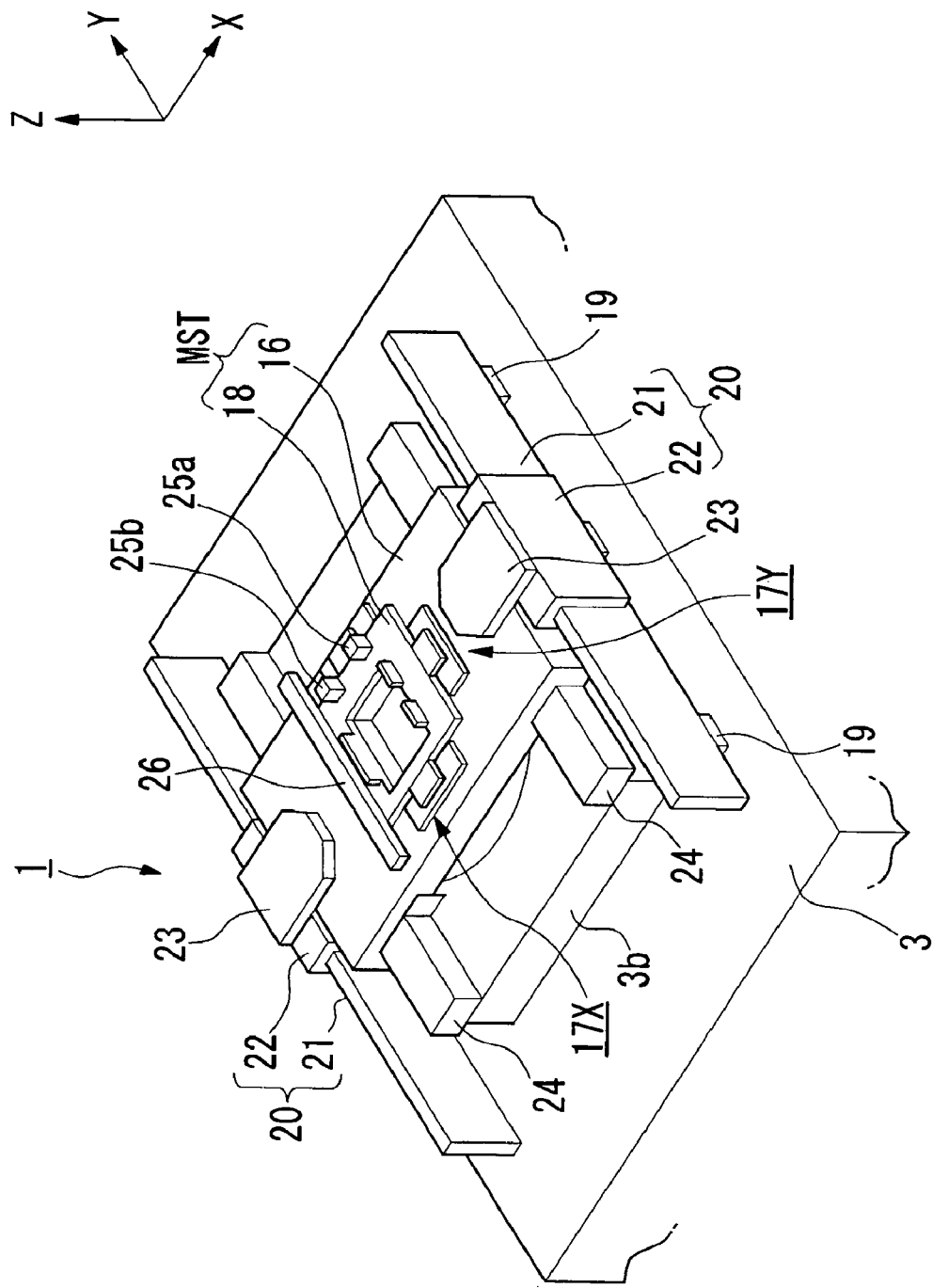
FIG. 2 is a schematic oblique view of a stage apparatus that constitutes the same exposure apparatus.

FIG. 2 is a schematic oblique view of the stage apparatus 1 that comprises the mask stage MST.

As shown in FIG. 2, the stage apparatus 1 (mask stage MST) comprises: a coarse movement mask stage 16, which is provided on the mask base plate 3; a fine movement mask stage 18, which is provided on the coarse movement mask stage 16; two Y linear motors 20, which are capable of moving the coarse movement stage 16 on the mask base plate 3 by a prescribed stroke in the Y axial directions; two Y guide parts 24 that are provided on an upper surface of an upper part protruding part 3b of the center part of the mask base plate 3 and that guide the coarse movement stage 16, which moves in the Y axial directions; and two X voice coil motors 17X and two Y voice coil motors 17Y, which are capable of finely moving the fine movement stage 18 on the coarse movement stage 16 in the X axial, Y axial, and θZ directions. Furthermore, the coarse movement stage 16 and the fine movement stage 18 are shown in FIG. 1 as a simplified single stage.

Each of the Y linear motors 20 comprises: a stator 21, which comprises a coil unit (armature unit) that is provided on the mask base plate 3 so that it extends in the Y axial directions, and a mover 22, which is provided corresponding to the stator 21 and comprises a magnet unit that is fixed to the coarse movement stage 16 via a coupling member 23. Furthermore, these stators 21 and movers 22 constitute moving magnet type linear motors 20, and the coarse movement stage 16 (mask stage MST) moves in the Y axial directions by the drive caused by the electromagnetic interaction between the movers 22 and the stators 21. Each of the stators 21 is levitationally supported by the mask base plate 3 by a plurality of air bearings 19, which are noncontact bearings. Consequently, due to the law of conservation of momentum, the stators 21 move in the -Y direction in accordance with the movement of the coarse movement stage 16 in the +Y direction. The movement of the stators 21 offset the reaction force attendant with the movement of the coarse movement stage 16, and can also prevent a change in the position of the center of gravity. Furthermore, the stators 21 may be provided to the reaction frame 5 instead of to the mask base plate 3. If the stators 21 are provided to the reaction frame 5, then the air bearings 19 may be omitted and the reaction force that acts on the stators 21 as a result of the fixing of the stators 21 to the reaction frame 5 and the movement of the coarse movement stage 16 may be released to the floor via the reaction frame 5.

The Y guide parts 24 guide the coarse movement stage 16, which moves in the Y axial directions, and are fixed to the upper surface of the upper part protruding part 3b, which is formed in the center part of the mask base plate 3, so that they extend in the Y axial directions. In addition, air bearings, which are noncontact bearings and are not shown, are provided between the coarse movement stage 16 and the Y guide parts 24, and thereby the coarse movement stage 16 is noncontactually supported by the Y guide parts 24.

The fine movement stage 18 chucks the mask M via a vacuum chuck, which is not shown. A pair of Y movable mirrors 25a, 25b, each of which is formed as a corner cube, are fixed to an end part of the fine movement stage 18 in the +Y direction, and an X movable mirror 26, which is formed as a planar mirror that extends in the Y axial directions, is fixed to an end part of the fine movement stage 18 in the -X direction. Furthermore, three laser interferometers (none of which are shown), which irradiate the movable mirrors 25a, 25b, 26 with length measuring beams, measure the distance to each of the movable mirrors, and thereby the position of the mask stage MST in the X axial, Y axial, and θZ directions is detected with high accuracy. Based on the detection results of the laser interferometers, the control apparatus CONT controls the position of the mask M (mask stage MST), which is supported by the fine movement stage 18, by driving each of the motors, including the Y linear motors 20, the X voice coil motors 17X, and the Y voice coil motors 17Y.

Returning to FIG. 1, the pattern image of the mask M that passes through the opening K and the opening 3a enters the projection optical system PL. The projection optical system PL comprises a plurality of optical elements, which are supported by a lens barrel. The projection optical system PL is a reduction system that has a projection magnification of, for example, ¼ or ⅕. Furthermore, the projection optical system PL may also be an equal magnification system or an enlargement system. A flange part 10, which is integrated with the lens barrel, is provided to the outer circumference of the lens barrel of the projection optical system PL. Furthermore, in the projection optical system PL, the flange part 10 engages with a lens barrel base plate 12, which is supported substantially horizontally via vibration isolating units 11 by the step part 5b of the reaction frame 5.

The stage apparatus 2 comprises: the substrate stage PST; the substrate base plate 4, which supports the substrate stage PST so that it can move within the XY plane in the two dimensional directions; an X guide stage 35, which supports the substrate stage PST so that it is freely movable while guiding it in the X axial directions; an X linear motor 40, which is provided to the X guide stage 35, that can move the substrate stage PST in the X axial directions; and two Y linear motors (linear motors, drive apparatuses) 30, which are the linear motors according to the present invention and can move the X guide stage 35 in the Y axial directions. The substrate stage PST comprises a substrate holder PH that vacuum chucks the photosensitive substrate P, which is supported by the substrate stage PST via the substrate holder PH. In addition, a plurality of air bearings 37, which are noncontact bearings, is provided to the bottom surface of the substrate stage PST, which is noncontactually supported by the substrate base plate 4 via the air bearings 37. In addition, the substrate base plate 4 is supported substantially horizontally above the base plate 6 via vibration isolating units 13.

Figure 3:
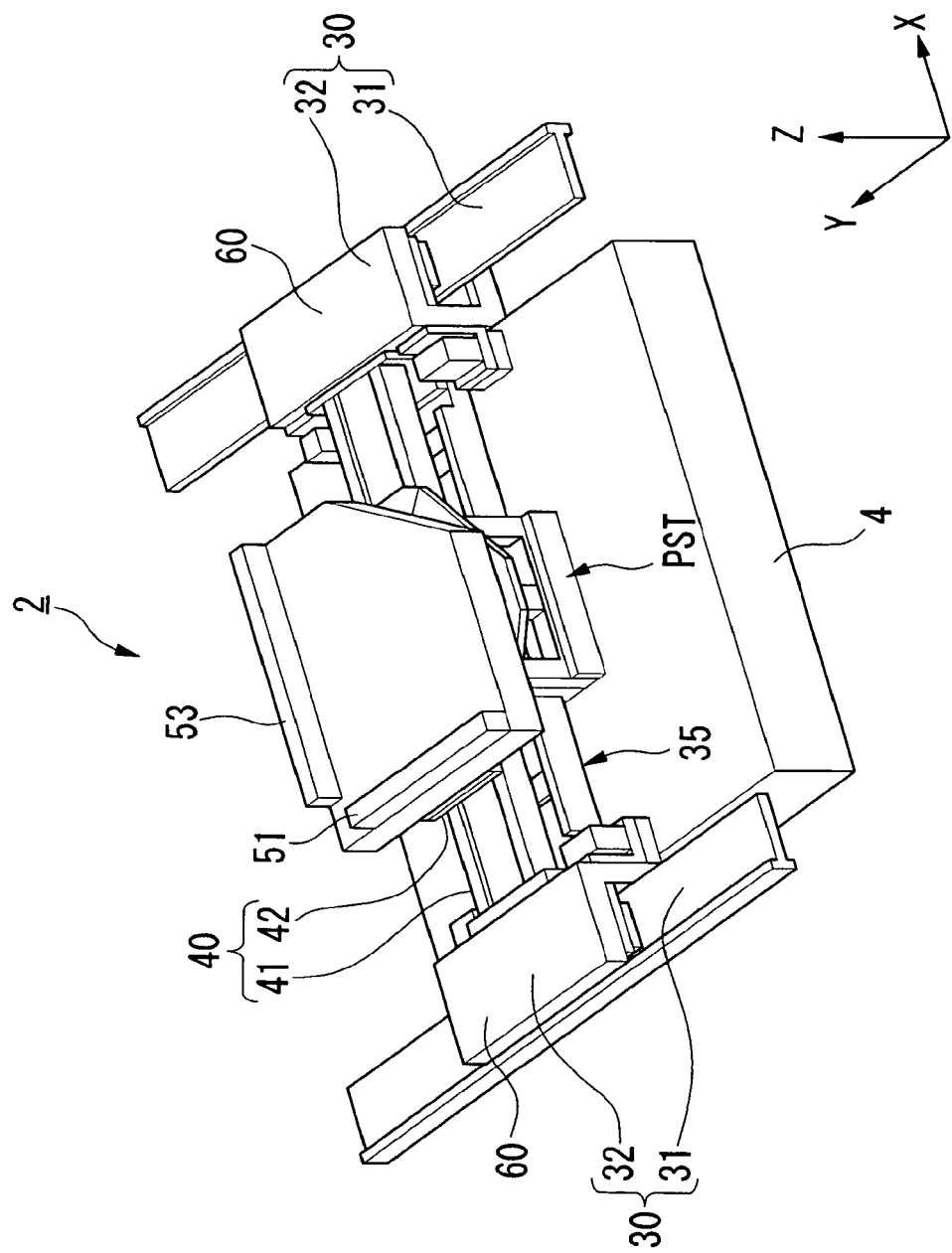
FIG. 3 is a schematic oblique view that shows one embodiment of a stage apparatus that comprises linear motors of the present invention.

FIG. 3 is a schematic oblique view of the stage apparatus 2, which comprises the substrate stage PST.

As shown in FIG. 3, the stage apparatus 2 comprises: the X guide stage 35, which has a shape that is long in the X axial directions; the X linear motor 40, which is capable of moving the substrate stage PST by a prescribed stroke in the X axial directions while guiding it via the X guide stage 35; and the two Y linear motors 30 that are provided at opposite ends of the X guide stage 35 in the longitudinal directions, respectively, and that are capable of moving the X guide stage 35 together with the substrate stage PST in the Y axial directions.

The X linear motor 40 comprises: a stator 41, which comprises a coil unit that is provided to the X guide stage 35 so that it extends in the X axial directions; and a slider 42, which comprises a magnet unit that is provided so that it corresponds to the stator 41 and is fixed to the substrate stage PST. The moving magnet type linear motor 40 thus comprises the stator 41 and the slider 42, and the substrate stage PST moves in the X axial directions by the drive that is produced by the electromagnetic interaction between the slider 42 and the stator 41. Here, the substrate stage PST is noncontactually supported by a magnetic guide, which comprises an actuator and a magnet, that maintains a gap of a prescribed size in the Z axial directions with respect to the X guide stage 35. The X linear motor 40 moves the substrate stage PST in the X axial directions in a state wherein it is noncontactually supported by the X guide stage 35.

The Y linear motors 30 are moving magnet type motors that are provided to opposite ends of the X guide stage 35 in the longitudinal directions; furthermore, each of the Y linear motors 30 comprises: a mover 32, which comprises a magnet unit; and a stator 31, which comprises a coil unit, that is provided so that it corresponds to the mover 32. Here, the stator 31 of each Y linear motor 30 is provided to a corresponding support part 36 (refer to FIG. 1), which is protrusively provided to the base plate 6. Furthermore, the stators 31 and the movers 32 are shown simplified in FIG. 1. The stators 31 and the movers 32 constitute the moving magnet type Y linear motors 30, each of which moves the X guide stage 35 in the Y axial directions by the drive produced by the electromagnetic interaction between its movers 32 and its stator 31. In addition, the X guide stage 35 can also be moved rotationally in the θZ directions by adjusting the drives of the Y linear motors 30. Accordingly, the substrate stage PST is capable of moving substantially integrally with the X guide stage 35 in the Y axial and the θZ directions by means of these Y linear motors 30.

Returning to FIG. 1, an X movable mirror 51, which is provided so that it extends in the Y axial directions, is provided to a side edge of the substrate stage PST on the −X side, and a laser interferometer 50 is provided at a position that corresponds to the X movable mirror 51. By irradiating laser light (detection light) toward a reflecting surface of the X movable mirror 51 and a reference mirror 52 that is provided to the lower end of the lens barrel of the projection optical system PL, and then measuring the relative displacement between the X movable mirror 51 and the reference mirror 52 based on the interference between the reflected light and the incident light, the laser interferometer 50 detects the real time positions of the substrate stage PST and, in turn, the photosensitive substrate P in the X axial directions with a prescribed resolving power. Similarly, a Y movable mirror 53 (not shown in FIG. 1, but refer to FIG. 3), which is provided so that it extends in the X axial directions, is provided to a side edge on the substrate stage PST on the +Y side, and a Y laser interferometer (not shown) is provided at a position that corresponds to the Y movable mirror 53; furthermore, by irradiating laser light toward a reflecting surface of the Y movable mirror 53 and a reference mirror (not shown) that is provided to the lower end of the lens barrel of the projection optical system PL, and then measuring the relative displacement between the Y movable mirror 53 and the reference mirror based on the interference between the reflected light and the incident light, the Y laser interferometer detects the real time positions of the substrate stage PST and, in turn, the photosensitive substrate P in the Y axial directions with a prescribed resolving power. The detection results of the laser interferometers are output to the control apparatus CONT, which controls the position of the substrate stage PST based thereon via the linear motors 30, 40.

Figure 4:
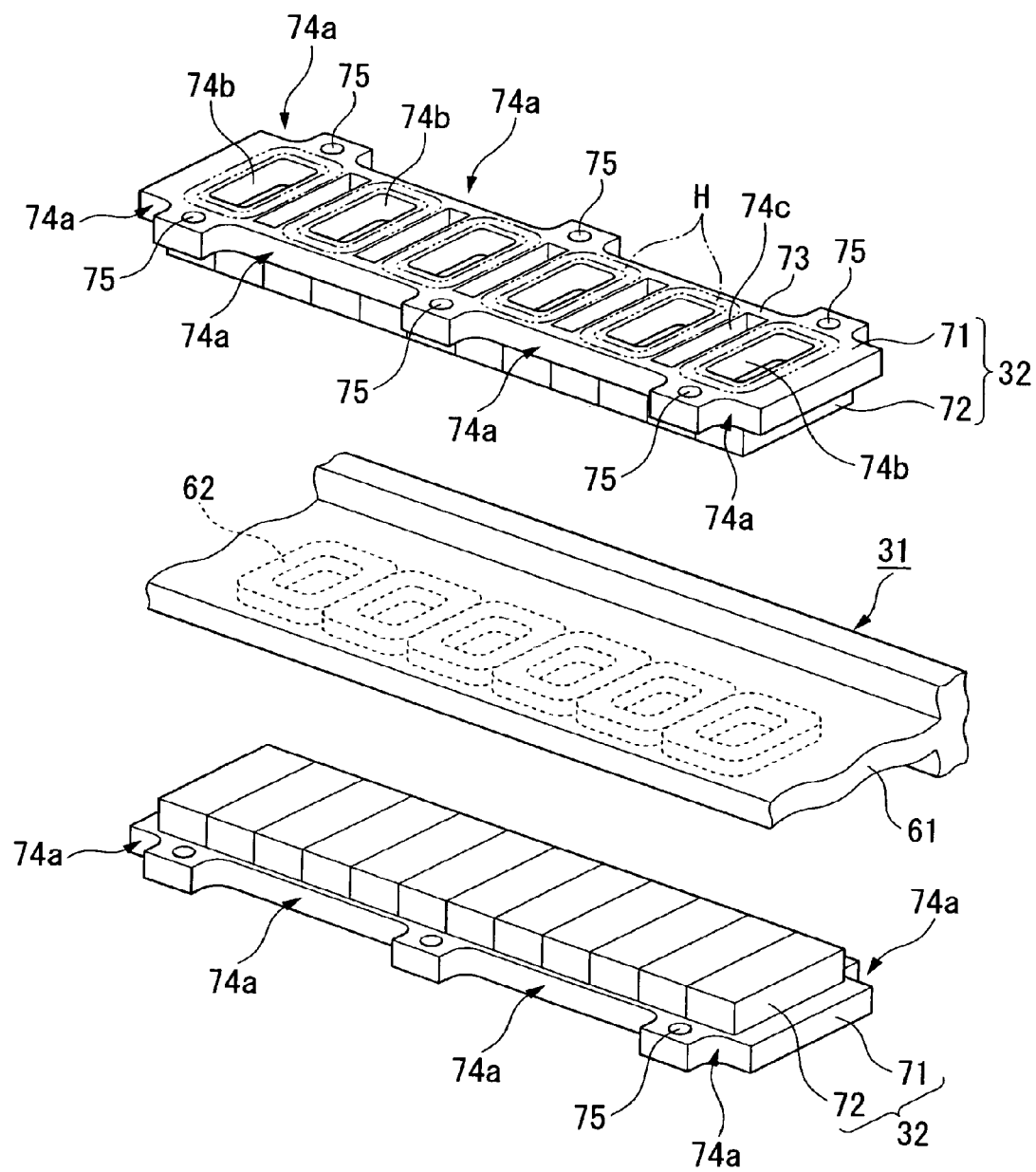
FIG. 4 is an exploded oblique view of linear motors 18, 21.

As shown in FIG. 4, the stator 31 of each Y linear motor 30 comprises a plurality of coil bodies 62, which are arrayed inside a coil jacket 61 in the length directions thereof.

In addition, the movers 32 of the Y linear motors 30 are provided to support members 60, which are U shaped in a Y directional view and provided to opposite ends of the X guide stage 35; furthermore, for each of the Y linear motors 30, the movers 32, which each comprise a yoke 71 and permanent magnets 72, are provided on opposite sides of the corresponding stator 31 so that they sandwich such and are spaced apart therefrom.

Figure 5:
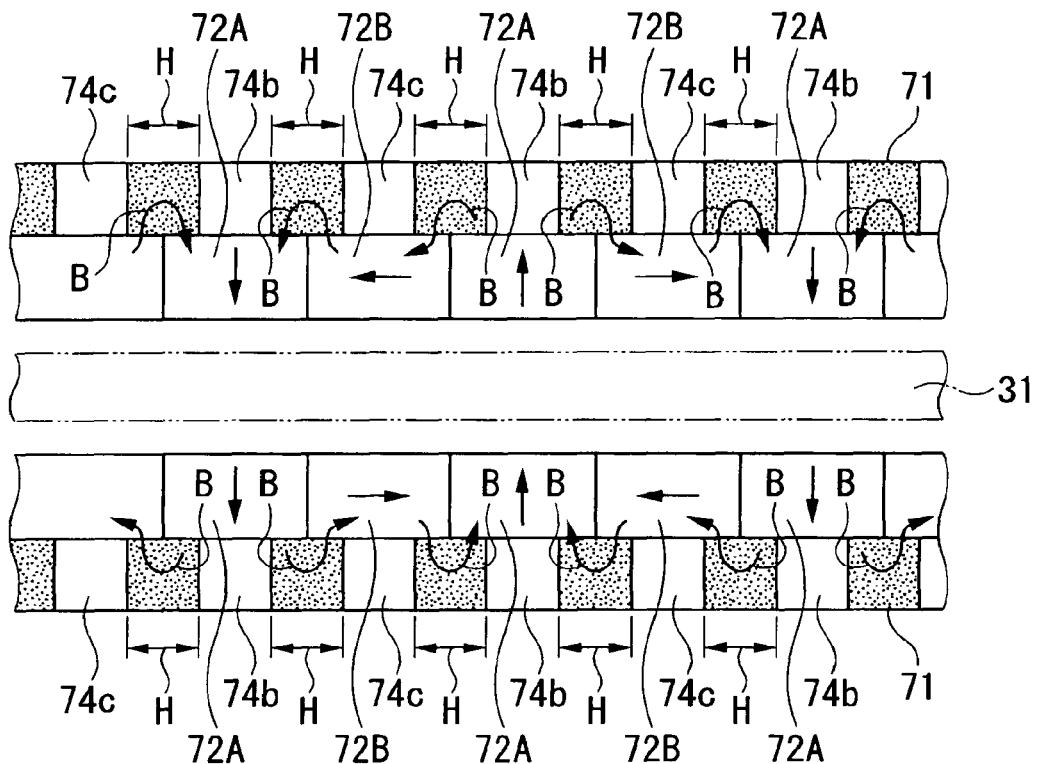
FIG. 5 shows the principal components of the Y linear motor.

After the permanent magnets 72 are magnetized, for example, in a block state, they are cut and arrayed; as shown in FIG. 5, the permanent magnets 72 are arrayed so that they alternate between main poles 72A, wherein the magnetization directions pass through the stators 31 (coil bodies 62) in the opposing directions (Z directions), and auxiliary poles 72B, wherein the magnetization directions are in the length directions (Y directions), and so that they form a magnetic path around the X axis. These permanent magnets 72 are fixed to one another and to the yoke 71 by an adhesive that has electrical insulating properties (resin adhesive and the like) in a mutually electrically insulated state.

Each of the yokes 71 holds the corresponding permanent magnet 72 and forms a magnetic path that guides the lines of magnetic force that leak out of the main poles 72A to the auxiliary poles 72B; in addition, each yoke 71 comprises a magnetic part (first portion) 73, which is formed from soft iron (a magnetic material) with a Steinmetz's constant of approximately 3,000, and nonmagnetic parts (second portions) 74a, 74b, 74c, which are formed by eliminating rectangular parts (in a plan view) of the yoke 71, that are disposed in accordance with the paths through which the eddy currents flow inside the yoke 71 as a result of the relative movement of the stator 31 and the movers 32.

The magnetic parts 73 of each of the yokes 71 are disposed: in regions H (in FIG. 4, the annular regions that are enclosed by a chain double-dashed line), which are in the vicinity of the outer perimetric part of each of the main poles 72A and are in a substantially magnetically saturated state due to the magnetic field acting on the corresponding permanent magnet 72; at locations where it is possible to maintain the strength needed to support the permanent magnets 72 without deforming—even if the permanent magnets 72 exert a large force; and in areas that surround holes 75 through which fastening members (not shown) are inserted when the yoke 71 is fastened and fixed to the support member 60.

The nonmagnetic parts 74a of each yoke 71 are formed by eliminating portions of the outer perimeter thereof—with the exception of the portions surrounding the holes 75. As shown in FIG. 5, each of the nonmagnetic parts 74b is surrounded by a corresponding saturation region H and is formed as a through hole, wherein magnetic saturation does not occur, at a position that opposes the corresponding main pole 72A. The nonmagnetic parts 74c are areas that lie between adjacent saturation regions H, and each of the nonmagnetic parts 74c is formed as a through hole, wherein magnetic saturation does not occur, at a position that opposes the corresponding auxiliary pole 72B. Namely, these nonmagnetic parts 74a, 74b, 74c are nonmagnetic areas that are formed by the presence of air, which is a nonmagnetic material and an insulator, in missing rectangular (in a plan view) portions of the soft iron, which is a magnetic material, (in other words, they are formed by substituting parts of the soft iron with air). In addition, the nonmagnetic parts 74b, 74c are each formed in a slit shape in the short side directions of the yoke 71.

The following explains the operation of the linear motors 30 discussed above. When an alternating current is supplied to the coil bodies 62 of one of the linear motors 30 under the control of the control apparatus CONT as drive current, the lines of magnetic force produced by the main poles 72A act on the coil bodies 62 and generate the Lorentz force. Each of the auxiliary poles 72B is attracted to the lines of magnetic force that are produced by the corresponding main poles 72A and are oriented in a direction that is the reverse of that of the coil bodies 62 (stators 31), and forms a magnetic path that guides those lines of magnetic force to an adjacent main pole 72A. In addition, the lines of magnetic force that are produced by each auxiliary pole 72B are also introduced into a corresponding main pole 72A and act on the corresponding coil body 62, thus adding to the number of magnetic force lines, i.e., the thrust, that acts on that coil body 62.

Here, because the magnetization directions of the main poles 72A and the auxiliary poles 72B are orthogonal, and because the lines of magnetic force cannot change their travel directions suddenly, the magnetic force lines that are guided from the main poles 72A to the auxiliary poles 72B and the magnetic force lines that are guided from the auxiliary poles 72B to the main poles 72A leak out from the vicinity of the junctions between the main poles 72A and the auxiliary poles 72B to the yoke 71, thus forming part of the magnetic paths in each yoke 71 (refer to symbols B in FIG. 5). Because each yoke 71 (magnetic part 73) is conductive, the action of the fluctuating magnetic fields generates eddy currents in the vicinity of its surface so that the currents offset the magnetic field fluctuations.

Figure 6:
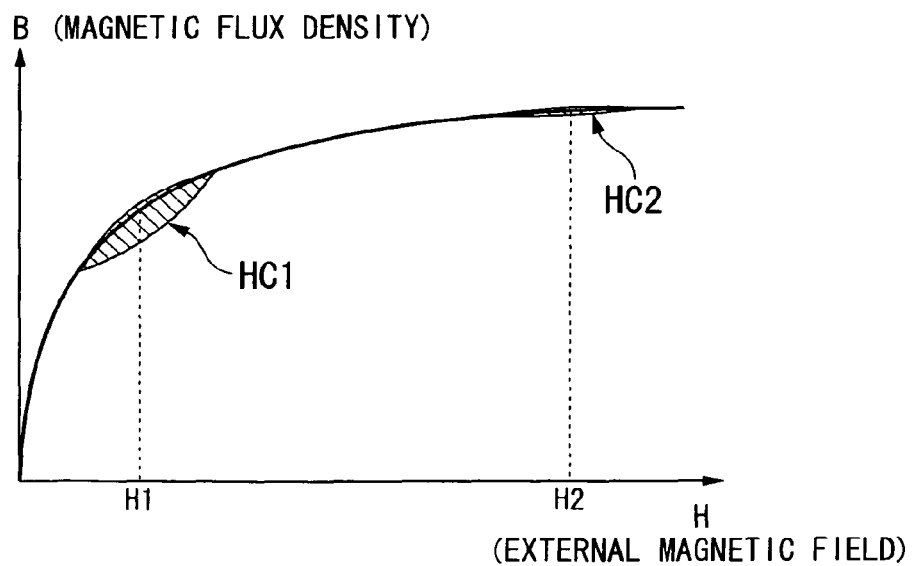
FIG. 6 shows an initial magnetization curve of a yoke.

Because of the action of the strong magnetic field produced by each of the permanent magnets 72 (main poles 72A), the magnetic field of each yoke 71 tends to become saturated, particularly at the saturation regions H that are in the vicinity of the junctions between the main poles 72A and auxiliary poles 72B. FIG. 6 shows an initial magnetization curve of one of the yokes 71 (soft iron). The slope of the initial magnetization curve indicates the magnetic permeability at the position at which the magnetic field acts on that yoke 71; as the magnetic field intensity increases, the magnetic field (magnetic flux density) approaches the saturation state, the slope of the initial magnetization curve becomes more gentle, and the magnetic permeability decreases.

Here, when the magnetic permeability is high, the skin depth through which the eddy currents flow is small, and therefore the eddy currents concentrate in this thin skin portion. If the electric currents concentrate in the thin portion, then the cross sectional area through which the electric currents flow decreases and the resistance value with respect to the eddy currents consequently increases, which also increases the amount of heat generated. In addition, when the fluctuating magnetic field penetrates the yoke 71, the eddy currents flow so that they inhibit the fluctuating magnetic field; however, after the eddy currents settle, if the magnetic permeability of the yoke 71 increases, then even larger magnetic force lines will be drawn into the yoke 71, and eddy currents will consequently flow so as to further inhibit the fluctuating magnetic field. Consequently, heat generation increases more in the portions of the yoke 71 at which magnetic permeability is high due to this synergistic effect.

Moreover, when a fluctuating magnetic field acts, the polarization vector in a magnetic domain that is inside the magnetic body rotates so that it is oriented in the direction of the fluctuating external magnetic field. In this case, if the magnetic hysteresis of the magnetic body is large, then an energy loss occurs when the polarization vector is rotated, which generates heat (hysteresis heat generation).

Accordingly, if the magnetic field (DC magnetic field) produced by each of the permanent magnets 72 is small (e.g., H1 in FIG. 6), then the hysteresis curve will follow a curve HC1, which is centered on H1. In addition, if the magnetic field produced by each of the permanent magnets 72 is large (H2 in FIG. 6), then the hysteresis curve follows a curve HC2, which is centered on H2. The heat generated as a result of hysteresis, i.e., so-called hysteresis heat generation, is proportional to the interior surface area of the hysteresis curve, and consequently the portion (H1), which represents the portion in the yoke 71 that is not magnetically saturated, has a hysteresis curve interior surface area that is larger than that of the portion (H2), which represents the portion that is magnetically saturated, and the amount of heat generated is also greater.

Consequently, in the present embodiment, for each yoke 71, the magnetic part 73 is disposed based on the saturation state of the magnetic field; further, nonmagnetic parts 74a, 74b, 74c are formed by eliminating outer perimetric parts that are outside of the saturation regions H and hardly function as a magnetic path, inner side areas that are surrounded by the saturation regions H, and areas between adjacent saturation regions H; it is thereby possible to suppress efficiently hysteresis heat generation and heat generation caused by the eddy currents that are generated if the nonmagnetic parts 74a, 74b, 74c have magnetic properties and are not magnetically saturated.

In addition, forming the plurality of the nonmagnetic parts 74b, 74c in the yoke 71 as slit shapes in the short side directions thereof divides the paths of the eddy currents and functions so as to make it possible to reduce the generation of the eddy currents themselves.

In addition, in the present embodiment, the permanent magnets 72 are fixed to one another and to the yoke 71 in an electrically insulated state, and it is therefore possible to divide the eddy currents that flow inside the permanent magnets 72, which further reduces the generation of the eddy currents and decreases the amount of heat generated. In particular, because the permanent magnets 72 are strongly magnetized and the interior of each is substantially completely magnetically saturated, hysteresis loss is low; further, because the magnetic permeability is substantially on par with air due to the magnetic saturation, the eddy currents are also low; thus, it is possible to suppress the heat generated by the permanent magnets 72.

The following explains the exposure operation in an exposure apparatus EX that is configured as described above.

Preparatory work, such as reticle alignment and baseline measurement, is performed by using, for example, a reticle microscope (not shown) and an off-axis alignment sensor (not shown), after which an alignment sensor is used to finish finely aligning (by, for example, EGA, i.e., enhanced global alignment) the photosensitive substrate P, and the array coordinates of a plurality of shot regions on the photosensitive substrate P are derived. Furthermore, while monitoring the measurement value of the laser interferometer 50, the linear motors 30, 40 are controlled, based on the alignment results, so as to move the substrate stage PST to the scanning start position in order to expose a first shot of the photosensitive substrate P. Furthermore, the scanning of the mask stage MST and the substrate stage PST in the Y directions via the linear motors 20, 30 is started; in addition, when both stages MST, PST reach their respective target scanning speeds, a blind mechanism is driven so as to illuminate a pattern area of the mask M with the set exposure illumination light, thereby starting the scanning exposure.

During this scanning exposure, the mask stage MST and the substrate stage PST are synchronously controlled via the linear motors 20, 30 so that the travel speed of the mask stage MST and the travel speed of the substrate stage PST in the Y directions maintain a velocity ratio that is in accordance with the projection magnification (⅕ magnification or ¼ magnification) of the projection optical system PL. If the substrate base plate 4 deforms attendant with the movement of the substrate stage PST, then it is possible to align the position of the surface of the photosensitive substrate P with the focal point position of the projection optical system PL by controlling the vibration isolating units 13 so as to correct for the deformation of the base plate 4.

In addition, the vibration isolating units 11 suppress residual vibrations of the lens barrel base plate 12. For example, each of the vibration isolating units 11 has an air mount and a voice coil motor. The air mount and the drive of the voice coil motor actively dampen the vibrations of the lens barrel base plate 12, similar to that described above when the center of gravity changes as the stages move. In addition, microvibrations that are not transmitted to the lens barrel base plate 12 (projection optical system PL) via the step part 5b of the main frame 5 are isolated, and thereby the lens barrel base plate 12 is insulated at the micro G level (G is the gravitational acceleration). Furthermore, the scanning exposure of the first shot on the photosensitive substrate P is completed by completing the illumination of the entire surface of the pattern area by successively illuminating the different areas of the mask M pattern area with the illumination light. Thereby, the pattern of the mask M is reduction transferred to the first shot region on the photosensitive substrate P via the projection optical system PL.

Thus, with the stage apparatuses and the exposure apparatus of the present embodiment, it is possible to suppress the generation of heat by each yoke 71 and the permanent magnets 72 even when the Y linear motors 30 are driven during the scanning exposure, which makes it possible to eliminate factors that reduce stage position detection accuracy, such as air fluctuations and thermal deformation of the surrounding members and apparatuses caused by heat generation, and thereby to prevent a reduction in pattern transfer accuracy.

Second Embodiment

Continuing, a second embodiment of the linear motor according to the present invention will now be explained, referencing FIG. 7.

The abovementioned first embodiment is configured by forming the nonmagnetic parts 74a, 74b, 74c, which comprise air, by eliminating parts of each yoke 71; however, in the second embodiment, nonmagnetic parts are formed from a nonmagnetic resin material. Furthermore, constituent elements in the present figure that are identical to those in the first embodiment, which are shown in FIGS. 1-6, are assigned identical symbols, and the explanations thereof are omitted.

Figure 7:
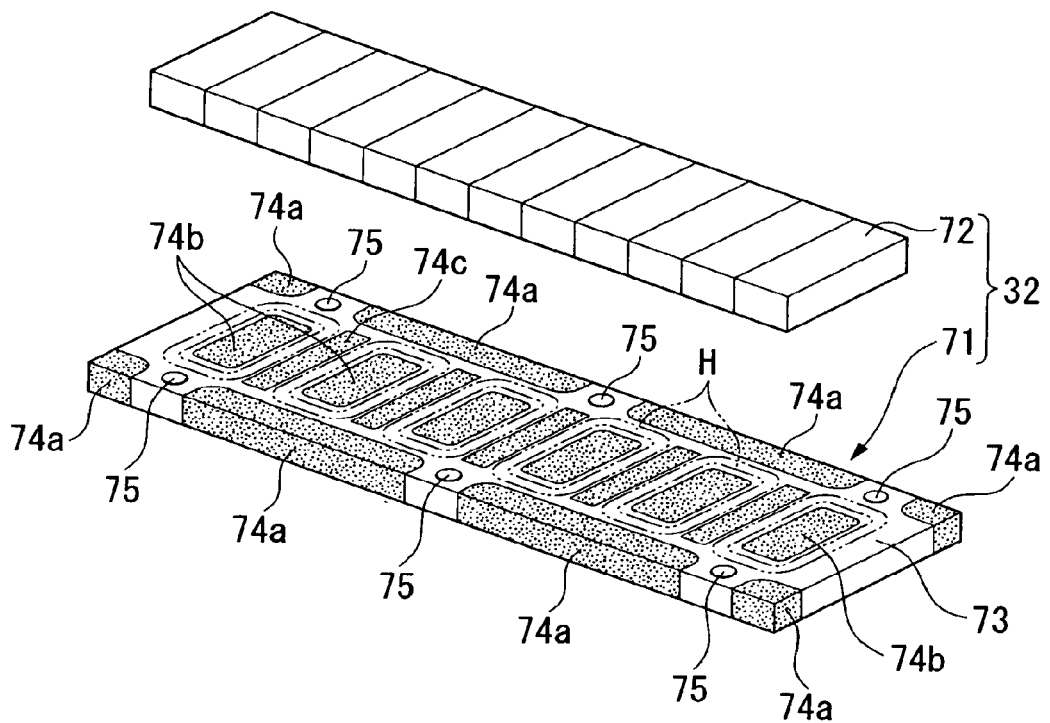
FIG. 7 shows a second embodiment of the Y linear motor according to the present invention.

As shown in FIG. 7, the yoke 71 in the present embodiment is configured by forming the nonmagnetic parts 74a, which are the outer perimetric parts, the nonmagnetic parts 74b, which are each formed at a position that is surrounded by the corresponding saturation region H, and the nonmagnetic parts 74c, which are formed in the areas between adjacent saturation regions H, from a resin material that is a nonmagnetic insulator. An epoxy resin, a high-strength engineering plastic, and the like can be used as the nonmagnetic resin material.

In addition to obtaining the same functions and effects as the abovementioned first embodiment, the portions of the yoke 71 in the first embodiment where parts have been eliminated are molded from a resin material, which makes it possible to increase mechanical strength. Normally, the yoke 71 requires great mechanical strength because a linear motor generates a large thrust and therefore a large force acts on the permanent magnets 72; nonetheless, strength decreases if parts of the yoke 71 are eliminated as in the first embodiment; however, with the present embodiment, the strength of the yoke 71 is improved by the use of the resin material, and it is therefore possible to support the permanent magnets 72, which exert a strong force, without difficulty.

Figure 8:
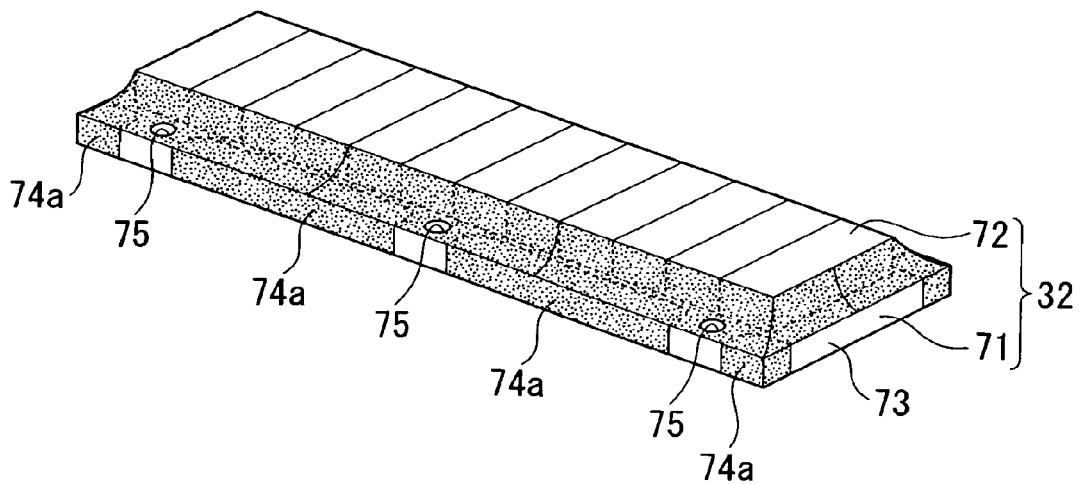
FIG. 8 shows another embodiment of the Y linear motor according to the present invention.

Furthermore, in addition to the nonmagnetic parts 74a, 74b, 74c the permanent magnets 72 may also be made of a nonmagnetic resin material and configured by integrally molding them with the yoke 71, as shown in FIG. 8.

Third Embodiment

Figure 9A:
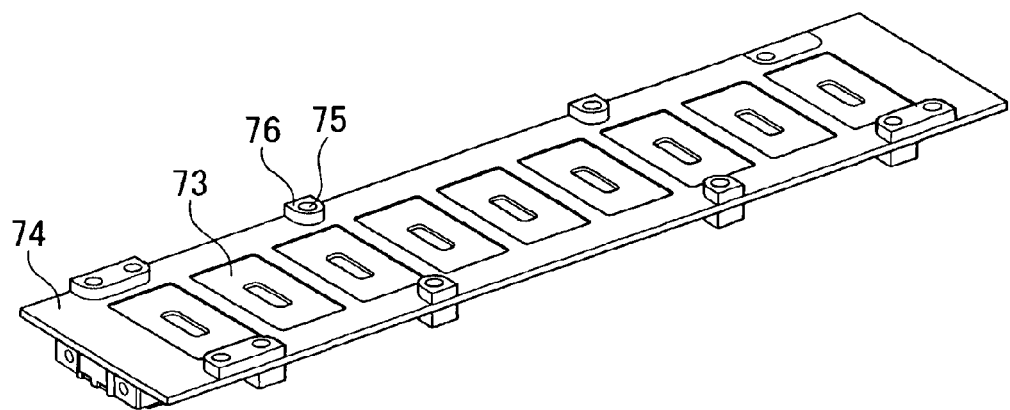
FIG. 9A is an assembly drawing that shows a third embodiment of the Y linear motor according to the present invention.
Figure 9B:
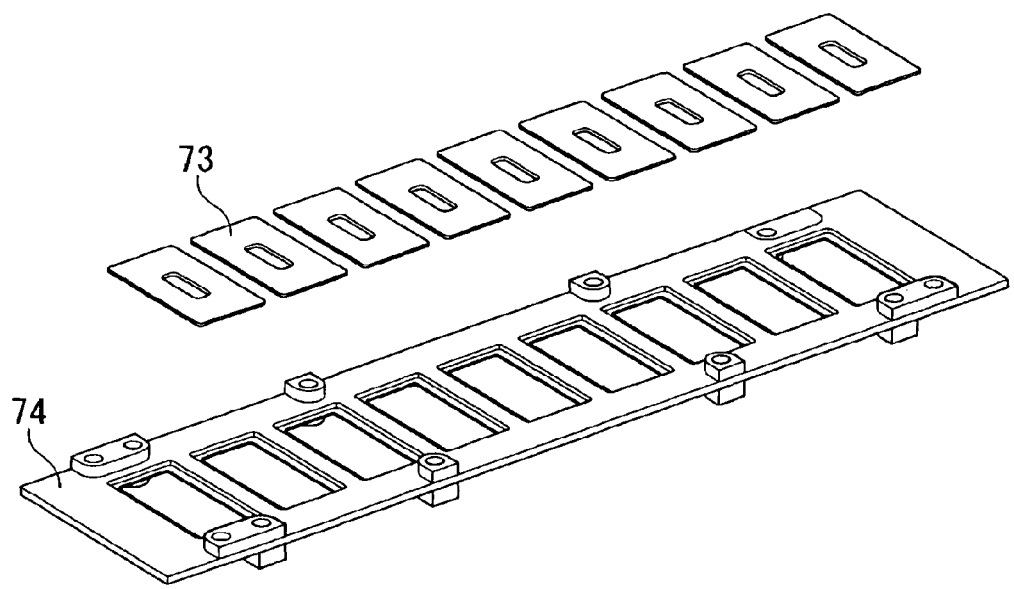
FIG. 9B is an exploded view that shows the third embodiment of the Y linear motor according to the present invention.

The following explains a third embodiment of the linear motor, referencing FIGS. 9A and 9B. Furthermore, constituent elements in the first embodiment shown in FIG. 1 through FIG. 6 that are identical to those in Figures are assigned identical symbols, and the explanations thereof are omitted.

In the present embodiment, magnetic material is disposed at locations in the yoke 71 at least in the locations where it is required; at other locations, a resin material (epoxy resin or the like) that has low electrical conductivity is disposed. However, the locations that are made of the resin material may instead be formed from a composite material (CFRP, i.e., thermosetting carbon fiber reinforced plastic), a ceramic, or the like.

Specifically, FIG. 9A shows an assembly drawing and FIG. 9B shows an exploded view; in addition, the yoke 71 is configured by fitting each annular (oblong, ring shape) magnetic material (first portion) 73 (soft iron, permendur, and the like), which corresponds to one of the saturation regions H, into a frame shaped member (second portion) 74 that is formed from CFRP. In addition, blocks 76, wherein a hole 75 is formed in order to fasten and fix the yoke 71 to the support member 60, are formed in the perimeter of the frame shaped member 74.

With this configuration, the percentage of the magnetic material portion that has a large specific gravity decreases, and the percentage of the portion that has a low specific gravity and high rigidity increases, which makes it possible to reduce the weight of the movers 32. Consequently, with the present embodiment, it is possible to reduce the thrust when the motor is driven, which makes it possible to suppress the generation of heat by the drive of the motor. Furthermore, in addition to CFRP, it is possible to use nonmagnetic metals, such as stainless steel, titanium alloy, and aluminum, as the material of the frame shaped member 74.

Fourth Embodiment

Figure 10:
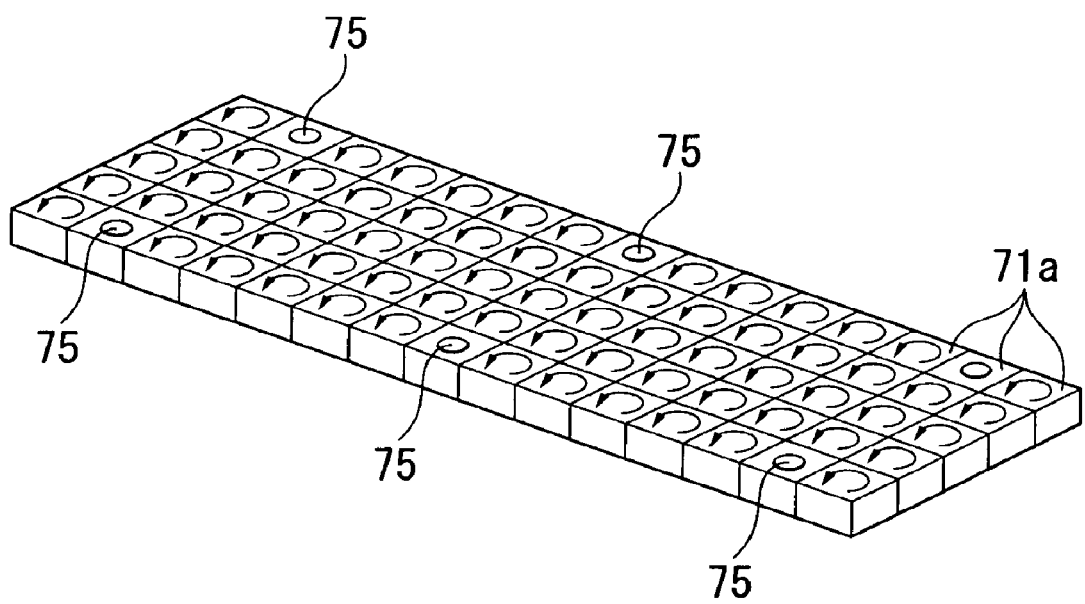
FIG. 10 shows a fourth embodiment of the Y linear motor according to the present invention.

The following explains a fourth embodiment of the linear motor, referencing FIG. 10.

In the present embodiment, the yoke 71 is configured by fixing multiple segmented bodies 71a, each of which is made of a magnetic material like soft iron, in a lattice shape using the abovementioned resin adhesive that has electrical insulating properties.

With this configuration, each of the segmented bodies 71a is electrically segmented; consequently, when eddy currents flow to the yoke 71, an eddy current is generated in each of the segmented bodies 71a, as shown by the arrows in FIG. 10. Consequently, with the present embodiment, eddy currents flow for a short amount of time and the settling time is reduced, which makes it possible to suppress the generation of heat by the eddy currents.

Furthermore, the third embodiment, wherein the magnetic material is segmented corresponding to the saturation regions H, therefore manifests similar effects.

Fifth Embodiment

Figure 11:
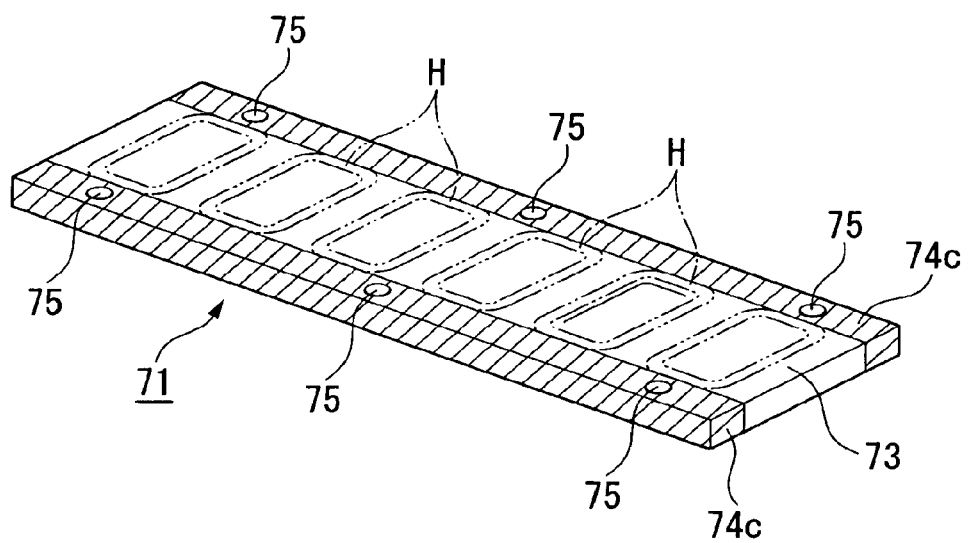
FIG. 11 shows a fifth embodiment of the Y linear motor according to the present invention.

The following explains a fifth embodiment of the linear motor, referencing FIG. 11.

The yoke 71 shown in FIG. 11 comprises nonmagnetic parts (second portions) 74c—one on each side in the width directions—that include holes 75, are formed from a nonmagnetic metal (e.g., nonmagnetic stainless steel), and are integrally fixed to the magnetic part 73, which is formed from a magnetic material such as soft iron, by, for example, welding.

With the present embodiment, it is possible to reduce the eddy currents, which can lower the magnetic permeability of the nonmagnetic parts 74c, and it is thereby possible to reduce the heat generated thereby. In addition, because the nonmagnetic parts 74c are nonmagnetic, hysteresis heat generation does not occur, which can contribute to a reduction in the amount of heat generated.

Furthermore, in addition to nonmagnetic stainless steel, it is also possible to select, for example, any one of titanium, copper, and aluminum to use as the nonmagnetic metal.

Sixth Embodiment

Figure 12:
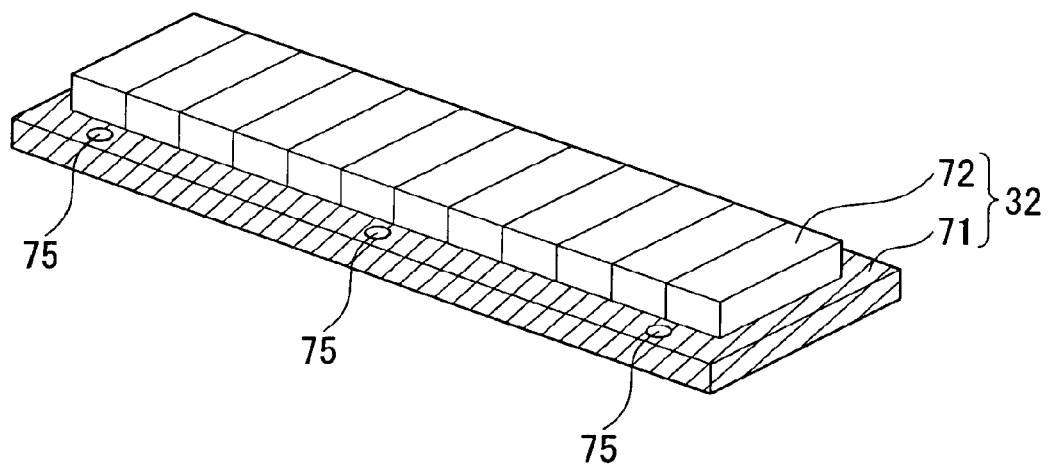
FIG. 12 shows a sixth embodiment of the Y linear motor according to the present invention.
Figure 13:
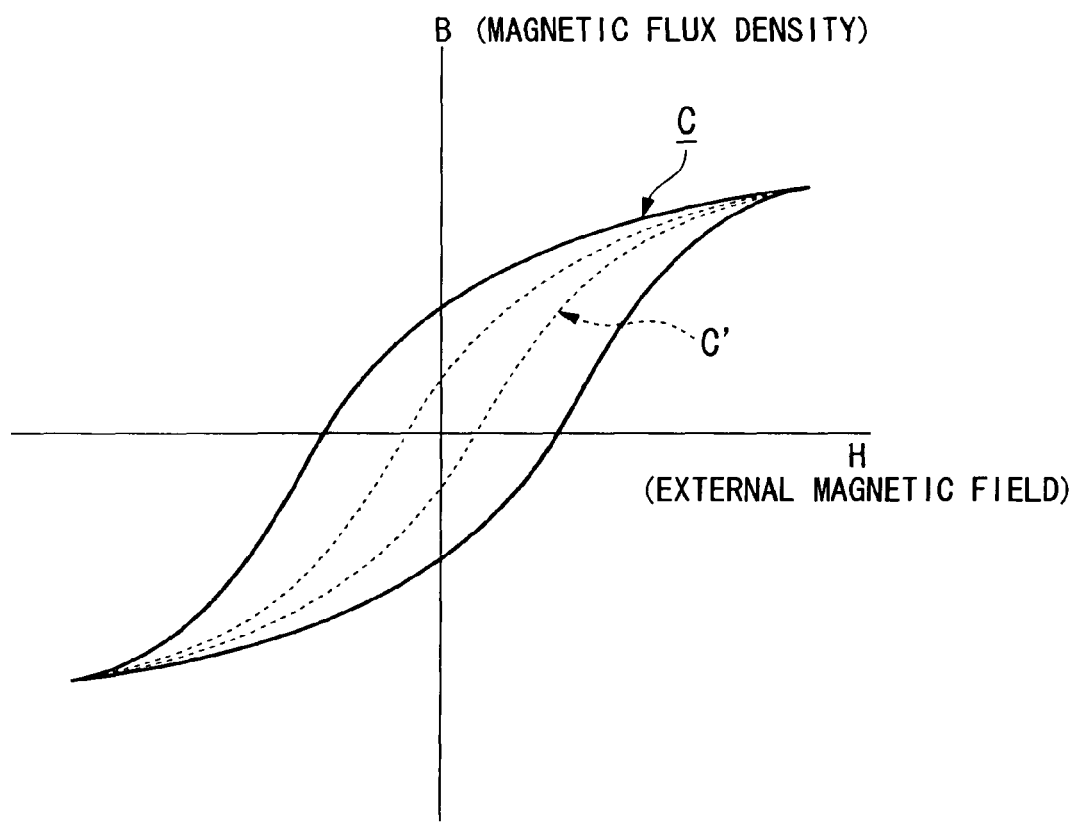
FIG. 13 shows a hysteresis curve of a magnetic body.

The following explains the sixth embodiment of the linear motor, referencing FIG. 12 and FIG. 13.

In the abovementioned embodiment, the magnetic parts and the nonmagnetic parts are disposed based on the magnetic saturation state of the yoke 71, thereby creating a configuration that suppresses heat generation caused by eddy currents as well as hysteresis heat generation; however, the present embodiment explains a configuration that suppresses heat generation by selecting the material of the yoke 71 based on its magnetic saturation characteristics.

Namely, as shown in FIG. 12, the yoke 71 in the present embodiment is not formed by the partitioning of the magnetic parts and the nonmagnetic parts, but rather is uniformly formed from a material that is selected based on Steinmetz's constant.

In greater detail, the magnetic property of the magnetic body is described by a hysteresis curve (BH curve) C shown in FIG. 13, wherein one fluctuation of the external magnetic field causes the hysteresis curve C to travel one cycle of the loop, which generates heat in proportion to the surface area enclosed by the hysteresis curve C.

Here, if we let B be the magnetic flux density that fluctuates, f be the fluctuation frequency, and V be the volume of the magnetic body, then the amount of heat generation P is proportional to the Steinmetz's constant $\eta$, as described in the equation below.

$$P = \eta \times B^{1.6} \times f \times V \quad (1)$$

It is well known that the Steinmetz's constant $\eta$ of soft iron is approximately 3,000; however, in the present embodiment, it is possible to reduce the amount of heat generated significantly by selecting a material with a Steinmetz's constant $\eta$ that is less than 1,000.

Examples of materials with a Steinmetz's constant $\eta$ that is less than 1,000 include ferrite (oxide of soft magnetic material, $\eta$=12) and permendur (soft magnetic material, $\eta$=44).

Because ferrite has electrical insulating properties (actually, because ferrite has finite electrical resistance, eddy currents do flow, but the amount of that flow is microscopic), virtually no heat is generated. In addition, because ferrite has little nonlinearity and the interior surface area of its hysteresis curve is small, it can contribute to a reduction in the amount of heat generated attendant with hysteresis loss.

In addition, permendur has a saturated magnetic flux density that exceeds that of soft iron and is a material that has a small amount of nonlinearity (i.e., hysteresis curve interior surface area). Consequently, particularly from the perspective of reducing hysteresis heat generation, it is effective to form the yoke 71 from permendur.

Seventh Embodiment

The following explains a seventh embodiment of the linear motor.

The yoke 71 in the present embodiment is formed from a soft iron that has been magnetically annealed.

Magnetic annealing is performed by heating the yoke material (soft iron) to the vicinity of its Curie point (approximately 600°-800° C.), and then cooling it. This treatment eliminates internal strain in the iron material; furthermore, because the structure of the magnetic domain grows larger, the interior surface area of a hysteresis curve C' decreases, as shown by the dotted line in FIG. 13. For example, it is known that magnetic annealing treatment reduces the Steinmetz's constant of soft iron from approximately 3,000 to approximately 500. Accordingly, the present embodiment reduces hysteresis heat generation to approximately ⅙ that of when magnetic annealing treatment is not performed.

Furthermore, magnetic annealing treatment can be adapted to any metallic magnetic body other than iron (soft iron) that includes the abovementioned permendur.

The above explained the preferred embodiments according to the present invention, referencing the attached drawings, but the present invention is of course not limited to these embodiments. Each of the constituent members, shapes and combinations described in the embodiments discussed above are merely exemplary, and it is understood that variations and modifications may be effected without departing from the spirit and scope of the invention.

For example, in the abovementioned embodiments, a configuration is adopted wherein the permanent magnets 72 are fixed to one another and to the yoke 71 by an adhesive that has insulating properties, but the present invention is not limited thereto and may be configured by fixing such with, for example, a resin film that has electrical insulating properties. Polyimide, glass epoxy, glass cross sheet, and the like can be used as the resin film.

In addition, the abovementioned embodiments are configured by adapting the present invention to the Y linear motors 30, but the present invention is not limited thereto and may be adapted to the X linear motor 40. Furthermore, the abovementioned embodiments are configured by adapting the present invention to the stage apparatus 2 on the substrate P side, but, additionally, it may be adapted to the stage apparatus 1 on the mask M side. In this case, the present invention can be adapted to the Y linear motors 20.

Furthermore, each linear motor in each of the abovementioned embodiments was explained as a so-called moving magnet type linear motor, wherein the stator has coil bodies and the slider has permanent magnets, but can also be adapted to a moving coil type linear motor wherein the slider has coil bodies and the stator has permanent magnets.

In addition, the photosensitive substrate P in each of the abovementioned embodiments is not limited to a semiconductor wafer for semiconductor devices, and can also be adapted to a glass substrate for a liquid crystal display device, a ceramic wafer for a thin film magnetic head, a mask or the original plate of a reticle (synthetic quartz, silicon wafer) used by an exposure apparatus, and the like.

The exposure apparatus EX can also be adapted to a step-and-scan type scanning exposure apparatus that scans and exposes the pattern of the mask M by synchronously moving the mask M and the photosensitive substrate P, as well as to a step-and-repeat type projection exposure apparatus that exposes the pattern of the mask M with the mask M and the photosensitive substrate P in a stationary state, and sequentially steps the substrate P.

The type of exposure apparatus EX is not limited to an exposure apparatus that exposes the pattern of a semiconductor device on a wafer in order to fabricate semiconductor devices, but can also be widely adapted to, for example, an exposure apparatus that exposes the pattern of a liquid crystal display device on a square glass plate in order to fabricate liquid crystal devices, and an exposure apparatus that fabricates thin film magnetic heads, imaging devices (CCDs), masks, or the like.

In addition to the bright lines, e.g., the g-line (436 nm), h-line (404.7 nm), or i-line (365 nm), generated by an ultrahigh pressure mercury vapor lamp, a KrF excimer laser (248 nm), an ArF excimer laser (193 nm), or an $F_2$ laser (157 nm), it is also possible to use a charged particle beam, such as an X-ray beam or an electron beam, as the light source of the exposure illumination light. For example, if an electron beam is used, then a thermionic emitting type substance, such as lanthanum hexaboride ($LaB_6$) or tantalum (Ta), can be used as the electron gun. Furthermore, if an electron beam is used, then a configuration that uses the mask M may be adopted, or a configuration that forms the pattern directly on the wafer without using the mask M may be adopted. In addition, the higher harmonics of, for example, a YAG laser or a semiconductor laser, may also be used.

If a far ultraviolet light beam from an excimer laser or the like is used, then a material, such as quartz or fluorite, that transmits the far ultraviolet light beam should be used for the glass material of the projection optical system PL; if an $F_2$ laser or an X-ray beam is used, then a catadioptric or a dioptric optical system (with a reflective type mask M) should be used; in addition, if an electron beam is used, then an electron optical system that comprises an electron lens and a deflector should be used. Of course, a vacuum state is created in the optical path through which the electron beam passes. In addition, the present invention can also be adapted to a proximity exposure apparatus that exposes the pattern of the mask M by bringing the mask M and the substrate P into close contact without using the projection optical system PL.

If a linear motor is used in the substrate stage PST or the mask stage MST as in the abovementioned embodiments, then it is not limited to an air levitation type that uses air bearings; for example, a magnetic levitation type that uses the Lorentz force may be used. In addition, each of the stages PST, MST may be a type that moves along a guide, or may be a guideless type.

The reaction force generated by the movement of the substrate stage PST may be mechanically discharged to the floor (ground) by using a frame member so that it is not transmitted to the projection optical system PL, as recited in Japanese Unexamined Patent Application, Publication No. H08-166475 (U.S. Pat. No. 5,528,118). The reaction force generated by the movement of the mask stage MST may be mechanically discharged to the floor (ground) by using a frame member so that it is not transmitted to the projection optical system PL, as recited in Japanese Unexamined Patent Application, Publication No. H08-330224 (U.S. Pat. No. 5,874,820).

The exposure apparatus EX of the embodiments in the present application is manufactured by assembling various subsystems, including each constituent element recited in the claims of the present application, so that prescribed mechanical, electrical, and optical accuracies are maintained, as described above. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes the mutual mechanical connection of the various subsystems, the wiring and connection of electrical circuits, the piping and connection of the atmospheric pressure circuit, and the like. Naturally, before the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus in a clean room, wherein the temperature, the cleanliness level, and the like are controlled.

Figure 14:
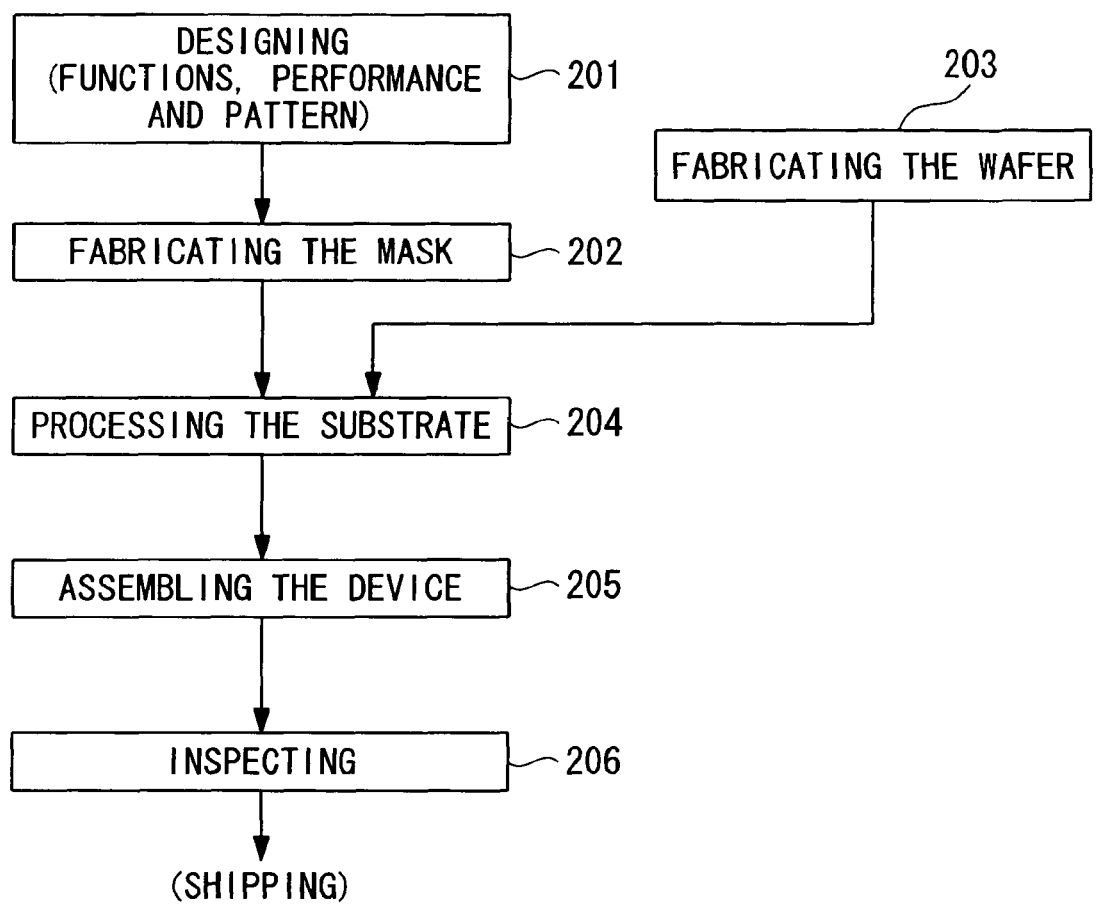
FIG. 14 is a flow chart diagram that shows one example of a semiconductor device fabrication process.

As shown in FIG. 14, a semiconductor device is manufactured by: a step 201 that designs the functions and performance of the device; a step 202 that fabricates a mask (reticle) based on this design step; a step 203 that fabricates a substrate, which is the base material of the device; a step 204 that includes a process wherein the exposure apparatus EX of the embodiments discussed above exposes a pattern of the mask onto the substrate; a device assembling step 205 (comprising a dicing process, a bonding process, and a packaging process); an inspecting step 206; and the like.

The invention claimed is:

1. A linear motor, comprising:
    a coil body; and
    a yoke that supports a magnetism generating body and that moves relative to the coil body; wherein,
    the yoke comprises a first portion that is formed from a magnetic material and disposed based on the saturation state of the magnetic field, which is generated by the magnetism generating body, in the yoke.

2. A linear motor according to claim 1, wherein
    the first portion is disposed at a portion where the magnetic field in the yoke is saturated.

3. A linear motor according to claim 1, wherein
    the yoke comprises a second portion that is formed from a nonmagnetic material.

4. A linear motor according to claim 3, wherein
    the second portion is formed from an insulator and is located at a position that corresponds to a path along which an eddy current flows in the yoke as a result of the relative movement between the coil body and the magnetism generating body.

5. A linear motor according to claim 3, wherein
    the second portion is formed from a nonmagnetic resin material.

6. A linear motor according to claim 3, wherein the second portion is formed from a nonmagnetic metal.

7. A linear motor, comprising:
a coil body; and
a yoke that supports a magnetism generating body and moves relative to the coil body; wherein,
the yoke is formed from a material that is selected based on a magnetic saturation characteristic.

8. A linear motor according to claim 7, wherein the yoke is formed from a material that has a Steinmetz's constant of less than 1,000.

9. A linear motor according to claim 7, wherein the yoke is formed from ferrite or permendur.

10. A linear motor according to claim 1, wherein the yoke and the magnetism generating body are integrally formed from a resin material.

11. A linear motor according to claim 1, wherein the yoke and the magnetism generating body are electrically insulated.

12. A stage apparatus, wherein a linear motor according to claim 1 is used as the drive apparatus.

13. An exposure apparatus that uses a stage apparatus to expose a pattern on a substrate, wherein the stage apparatus according to claim 12 is used as the stage apparatus.

\* \* \* \* \*